United States Patent [19]
Gardner et al.

[11] Patent Number: 6,025,735
[45] Date of Patent: Feb. 15, 2000

[54] PROGRAMMABLE SWITCH MATRIX AND METHOD OF PROGRAMMING

[75] Inventors: Robert M. Gardner; Jerald A. Hallmark, both of Gilbert; Daniel S. Marshall; William J. Ooms, both of Chandler, all of Ariz.

[73] Assignee: Motorola, Inc., Schaumburg, Ill.

[21] Appl. No.: 08/772,735

[22] Filed: Dec. 23, 1996

[51] Int. Cl.$^7$ ............................................. H03K 19/173
[52] U.S. Cl. ................................................. 326/38; 326/44
[58] Field of Search .................. 326/38, 39, 44, 326/49

[56] References Cited

U.S. PATENT DOCUMENTS

| | | | |
|---|---|---|---|
| 4,642,487 | 2/1987 | Carter | 326/38 |
| 4,670,749 | 6/1987 | Freeman | 326/38 |
| 5,361,224 | 11/1994 | Takasu | 365/145 |
| 5,361,225 | 11/1994 | Ozawa | 365/145 |
| 5,412,596 | 5/1995 | Hoshiba | 365/145 |
| 5,519,812 | 5/1996 | Ishihara | 326/112 |
| 5,600,264 | 2/1997 | Duong et al. | 326/39 |

FOREIGN PATENT DOCUMENTS 360046125  3/1985  Japan ........................................ 326/44

*Primary Examiner*—Michael Tokar
*Assistant Examiner*—Daniel D. Chang
*Attorney, Agent, or Firm*—Rennie William Dover; William E. Koch

[57] ABSTRACT

A switch network (22) in a Field Programmable Gate Array (FPGA) which operates as a combination of a programming transistor (34) and a ferroelectric transistor (32). The programming transistor (34) is selected to transfer a polarizing voltage to a gate terminal of the ferroelectric transistor (32) for programming the ferroelectric transistor (32) in an on-state. The ferroelectric transistor (32) functions as a nonvolatile latch and pass device to provide the electrical interconnect path that links multiple Configurable Logic Blocks (CLBs). The programming transistor (34) is selected to transfer a depolarizing voltage to the gate terminal of the ferroelectric transistor (32) for programming the ferroelectric transistor (32) in an off-state.

14 Claims, 3 Drawing Sheets

PROGRAMMABLE SWITCH MATRIX AND METHOD OF PROGRAMMING

BACKGROUND OF THE INVENTION

The present invention relates, in general, to integrated circuits and, more particularly, to programmable integrated circuits.

Field Programmable Gate Array (FPGA) integrated circuits are comprised of an array of Configurable Logic Blocks (CLBs) dynamically interconnected through programmable switches. Each of the CLBs includes logic gates, clocked latches, pass-gate transistors, and feedback structures having interconnects that are also configured through programmable switches. The switches are programmed by data stored in configuration memory cells. Thus, the specific logic functions performed within the CLB as well as the interconnect between multiple CLBs are configured by specific data in the cells.

An electrical signal in an FPGA is typically transferred through multiple programmable switches prior to reaching its destination. The programmable switches are comprised of either N-channel and P-channel complementary transistors or N-channel pass-gate transistors controlled by the configuration memory cells. The configuration memory cells require considerable area for the active transistor devices of the cells and for the metal interconnects that route the serial data between cells. Additional area is required for the metal interconnecting each of the memory cells to the corresponding complementary transistors or pass-gate transistors that form the programmable switches.

The configuration memory cells lose stored data when power is removed from the FPGA. An external nonvolatile memory, such as an Electrical Erasable Programmable Read Only Memory (EEPROM), provides the configuration data that reprograms the internal cells after a power loss. The reprogramming process is relatively slow due to the use of an external nonvolatile memory for providing configuration data.

Accordingly, it would be advantageous to have programmable switches that occupy a small active area in an FPGA while maintaining a high current carrying capability. It would be of further advantage to have a method for programming the switches thereby allowing logic reprogramming during circuit operation. In addition, it is desirable to have switches capable of retaining switch information during power interruption thereby eliminating the need for reprogramming the FPGA after a power loss. Another desired advantage would eliminate the external nonvolatile memory whose data can be probed during reprogramming for determining the configuration of the FPGA.

DETAILED DESCRIPTION OF THE DRAWINGS

A latch and pass-gate transistor combination are often used in integrated circuits for controlling the transfer of electronic signals from a logic source to a logic destination. For instance, some communication circuits have a switch matrix that has multiple inputs and outputs for routing a signal appearing at an input terminal to selected output terminals. Latches and pass-gate transistors are used to route the input signals to the output terminals. Microprocessors also use latch and pass-gate transistor combinations to route internally generated signals within logic blocks and between logic blocks and output terminals. In accordance with the present invention, a ferroelectric transistor serves as a latch and programmable transistor combination that provides a low power nonvolatile latch function having internal memory.

It should be noted that ferroelectric devices are also described in U.S. patent application Ser. No. 08/772,744, Attorney's Docket No. CR96-056, entitled "FERROELECTRIC TRANSISTOR LOGIC FUNCTIONS AND METHOD FOR PROGRAMMING", filed on Dec. 23, 1996, by Ooms et al., and assigned to Motorola, Inc.; U.S. patent application Ser. No. 08/772,736, Attorney's Docket No. CR96-132, entitled "CONFIGURABLE MONOLITHIC SEMICONDUCTOR CIRCUIT AND METHOD FOR CONFIGURING", filed on Dec. 23, 1996, by Gardner et al., and assigned to Motorola, Inc.; U.S. patent application Ser. No. 08/772,743, Attorney's Docket No. CR96-067, entitled "PROGRAMMABLE DISPLAY MATRIX AND METHOD OF PROGRAMMING", filed on Dec. 23, 1996, by Ooms and assigned to Motorola, Inc. The U.S. Patent Applications entitled "FERROELECTRIC TRANSISTOR LOGIC FUNCTIONS AND METHOD FOR PROGRAMMING" (Attorney Docket No. CR96-056), "CONFIGURABLE MONOLITHIC SEMICONDUCTOR CIRCUIT AND METHOD FOR CONFIGURING" (Attorney Docket No. CR96-132), and "PROGRAMMABLE DISPLAY MATRIX AND METHOD OF PROGRAMMING" (Attorney Docket No. CR96-067) are hereby incorporated herein by reference.

Figure 1:
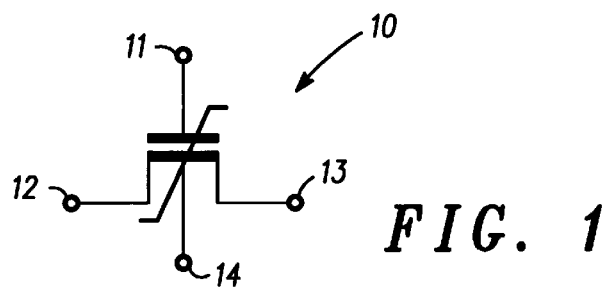
FIG. 1 is a schematic diagram of a ferroelectric programmable transistor in accordance with the present invention.

FIG. 1 is a schematic diagram of a ferroelectric programmable transistor 10 in accordance with the present invention. By way of example, ferroelectric transistor 10 is an N-channel Field Effect Transistor (FET) structure having a gate terminal 11, a drain terminal 12, a source terminal 13, and a bulk or body terminal 14. It should be noted that gate terminal 11 serves as a control electrode and drain and source terminals 12 and 13, respectively, serve as current carrying electrodes.

Figure 2:
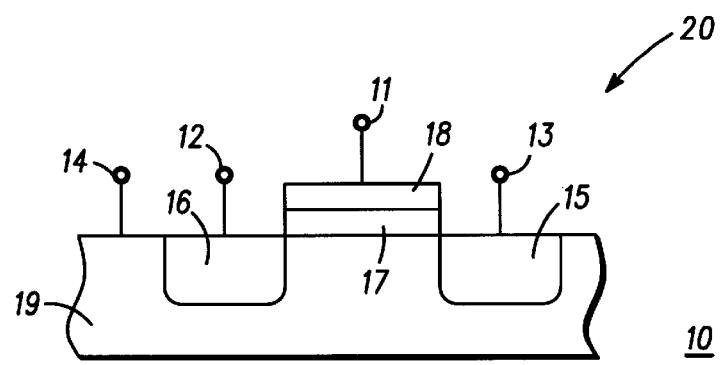
FIG. 2 is a cross sectional view of the ferroelectric programmable transistor of FIG. 1.

FIG. 2 is a cross sectional view of ferroelectric programmable transistor 10 of FIG. 1. It should be noted that the same reference numbers are used in the figures to denote the same elements. Ferroelectric programmable transistor 10 is comprised of a semiconductor material 19 having a gate structure 20 formed thereon. In accordance with one embodiment of the present invention, gate structure 20 is comprised of a ferroelectric material 17 and a conductive or gate material 18, wherein ferroelectric material 17 is preferably grown on semiconductor material 19. Ferroelectric material 17 serves as a gate dielectric material of ferroelectric transistor 10. In addition, ferroelectric programmable transistor 10 has source and drain regions 15 and 16, respectively. A source terminal 13 contacts source region 15, a drain terminal 12 contacts drain region 16, and a gate terminal 11 contacts gate material 18. A bulk or body terminal 14 contacts semiconductor material 19.

Ferroelectric transistors are also referred to as ferrogate devices or transistors. Although ferroelectric transistor 10 is shown as an N-channel Field Effect Transistor (FET) structure, it should be understood this is not a limitation of the present invention. In other words, ferroelectric transistor 10 can be a P-channel FET structure. Further, ferroelectric transistor 10 operates as either an N-channel enhancement mode device or an N-channel depletion mode device.

The threshold voltage, $V_{TH}$, for a non-ferroelectric Metal Oxide Semiconductor Field Effect Transistor (MOSFET) device is determined by the semiconductor material, the type of gate material, the impurities at the interface between the gate dielectric material and the semiconductor material, and the doping concentration of the bulk region of the semiconductor material. In addition, threshold voltage, $V_{TH}$, is dependent on the voltage potential between a source terminal and a bulk terminal. This effect is commonly referred to as body effect.

Ferroelectric material 17 of ferroelectric transistor 10 introduces a shift in the carrier level of the channel that forms between the source and drain terminals that affects the threshold voltage, $V_{TH}$. When a voltage supplied to gate terminal 11 is above a value of +VDD, the ferroelectric material becomes polarized in an up-polarization state, where VDD is an upper supply voltage. The voltage causing ferroelectric material 17 to become polarized in the up-polarization state is referred to as a polarizing voltage. When the voltage supplied to gate terminal 11 is below a value of about −VDD, ferroelectric material 17 becomes polarized in a down-polarization state. The voltage causing ferroelectric material 17 to become polarized in the down-polarization state is referred to as a depolarizing voltage. Voltage values between the polarizing voltage and the depolarizing voltage do not cause the ferroelectric transistor to change state. By way of example, a supply voltage for VDD of about 3 volts requires a polarizing voltage of greater than about 3 volts for programming ferroelectric transistor 10 in an up-polarization state. A depolarizing voltage of less than about −3 volts is required for programming ferroelectric transistor 10 in a down-polarization state.

The polarization of ferroelectric material 17 shifts the threshold voltage, $V_{TH}$, between one of two stable states. By way of example, an N-channel ferroelectric transistor is used and the control voltage is allowed to float after programming, the threshold voltage, $V_{TH}$, has been shifted to a value greater than a logic high in the up-polarization state or to a value below a logic low potential in the down-polarization state. In this embodiment, the gate terminal 11 can either float or be set between a logic low value and a logic high value without causing ferroelectric transistor 10 to be reprogrammed. In the down-polarization state with the threshold voltage, $V_{TH}$, having a value below −VDD, ferroelectric transistor 10 transmits the full logic voltage signal between drain terminal 12 and source terminal 13. Ferroelectric transistor 10 does not get reprogrammed by passing the logic levels. As an example, programming voltages can be above the supply voltage VDD and below −VDD.

For an N-channel ferroelectric FET structure in the up-polarization state, a positive charge layer is formed in a portion of the ferroelectric material adjacent the interface between ferroelectric material 17 and semiconductor material 19. The positive charge attracts electrons from a bulk portion of semiconductor material 19 to the portion of the semiconductor material between source region 15 and drain region 16. The electrons increase the conduction current in ferroelectric transistor 10 such that the current is higher than that of a non-ferroelectric MOSFET device with VDD applied to its gate. When the ferroelectric transistor is in the down-polarized state, negative charge is generated in a portion of the ferroelectric material adjacent the interface between ferroelectric material 17 and semiconductor material 19. The negative charge attracts holes to the semiconductor material surface that blocks formation of a conduction channel.

Figure 3:
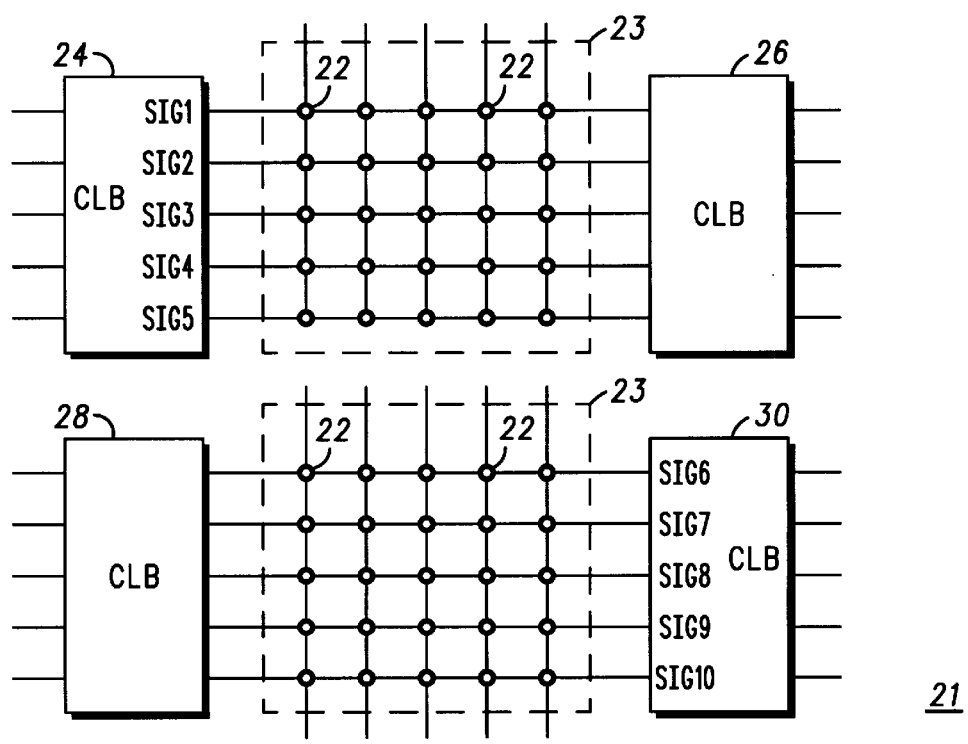
FIG. 3 is a block diagram of a reconfigurable memory architecture having CLBs interconnected through switch networks in accordance with the present invention.

FIG. 3 is a block diagram of reconfigurable memory architecture 21 having CLBs 24, 26, 28, and 30 interconnected through a programmable switch matrix 23 in accordance with the present invention. CLBs 24, 26, 28, and 30 have input and output terminals accessible from either side of the CLB. For example, CLB 24 has input terminals SIG1 and SIG2, and output terminals SIG3, SIG4, and SIG5, while CLB 30 has input terminals SIG6, SIG7, and SIG8, and output terminals SIG9 and SIG10. It should be noted that each CLB can perform a different logic function and have different numbers of input and output terminals.

Programmable switch matrix 23 is comprised of a plurality of switch networks 22 which are also referred to as arrays of field programmable gate array switches, programmable switch elements, programmable switch networks, or pass-gate switches having switchable conduction paths. CLB 24 has output terminals coupled to the input terminals of CLB 26 via switch networks 22. In addition, the output terminals of CLB 24 are coupled to the input terminals of CLB 28 and CLB 30 via switch networks 22. It should be noted that programmable switch matrix 23 provides a path for selectively connecting any output terminal from CLB 24 to any input terminal of CLBs 26, 28, or 30. Likewise, any output terminal from CLB 26 may be selectively connected to any input terminal of CLBs 24, 28, and 30; any output terminal from CLB 28 may be selectively connected to any input terminal of CLBs 24, 26, and 30; and any output terminal from CLB 30 may be selectively connected to any input terminal of CLBs 24, 26, and 28.

Figure 4:
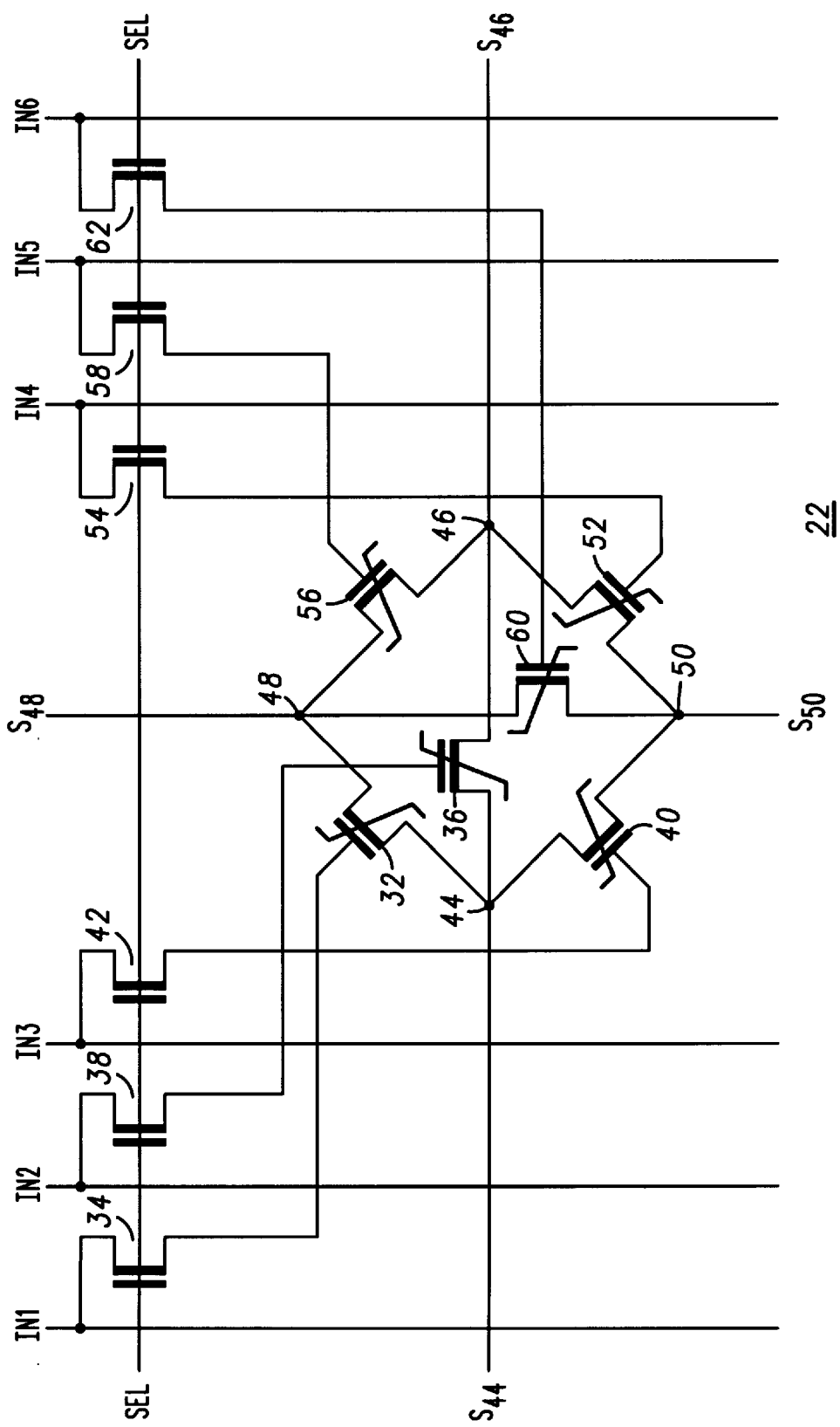
FIG. 4 is a schematic diagram of the switch network of FIG. 3 in accordance with the present invention.

FIG. 4 is a schematic diagram of switch network 22 of FIG. 3 in accordance with the present invention. Switch network 22 includes a plurality of programmable ferroelectric transistors 32, 36, 40, 52, 56, and 60 which cooperate with programming transistors 34, 38, 42, 54, 58, and 62 to provide a configurable electrical conduction path.

The gate terminals of programming transistors 34, 38, 42, 54, 58, and 62 are commonly connected to each other and are coupled for receiving a selection signal, SEL. The source terminals of programming transistors 34, 38, 42, 54, 58, and 62 are coupled for receiving programming signals at input terminals IN1, IN2, IN3, IN4, IN5, and IN6, respectively. The drain terminals of programming transistors 34, 38, 42, 54, 58, and 62 are connected to the gate terminals of ferroelectric transistors 32, 36, 40, 52, 56, and 60, respectively.

The source terminal of ferroelectric transistor 32 and the drain terminals of ferroelectric transistors 56 and 60 are commonly connected to form a node 48. The source terminals of ferroelectric transistors 36 and 56 and the drain terminal of ferroelectric transistor 52 are commonly connected to form a node 46. The source terminals of ferroelectric transistor 52 and 60 and the drain terminal of ferroelectric transistor 40 are commonly connected to form a node 50. The source terminal of ferroelectric transistor 40 and the drain terminals of ferroelectric transistors 32 and 36 are commonly connected to form a node 44. As those skilled in the art are aware, source and drain terminals are interchangeable. Nodes 44, 46, 48, and 50 are connected to terminals $S_{44}$, $S_{46}$, $S_{48}$, and $S_{50}$, respectively.

Figure 5:
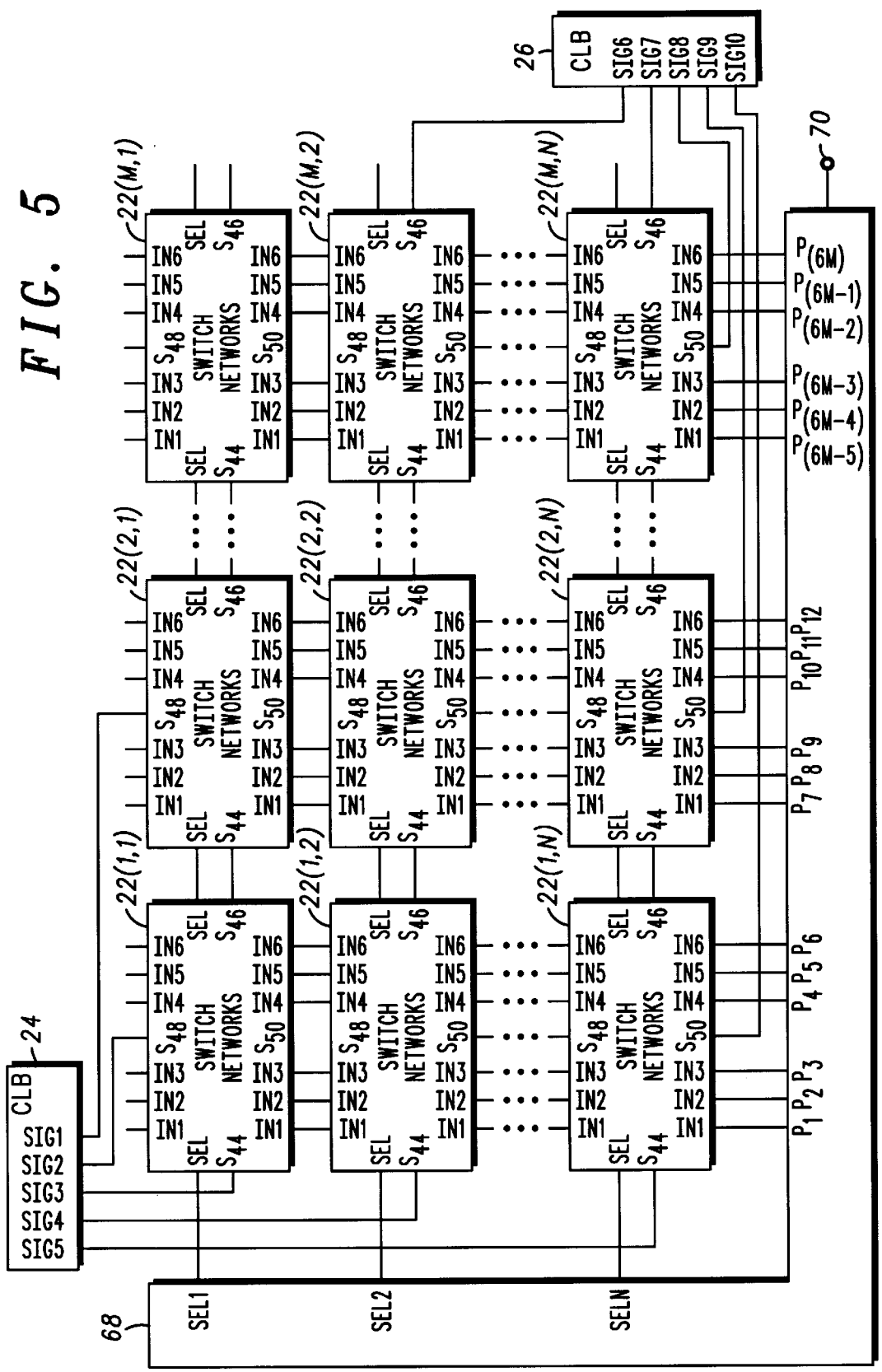
FIG. 5 is a block diagram showing select lines and programming lines connecting the switch networks of FIG. 4.

FIG. 5 is a block diagram of a module 68 capable of switchably coupling CLBs together. In accordance with one embodiment of the present invention, module 68 is a shiftregister having an input terminal 70 coupled for receiving data that specifies a coupling configuration for coupling CLBs 24 and 26 via switch networks 22 of switch matrix 23. More particularly, data at input terminal 70 contains the information for signals $SEL_1$–$SEL_N$ and $P_1$–$P_{6M}$. In other words, the data for the signals $SEL_1$–$SEL_N$ and $P_1$–$P_{6M}$ that program the switch networks 22 in the (M×N) matrix is serially shifted through module 68. It should be understood that the selection signal SEL of FIG. 4 refers to a selection signal $SEL_N$ for a single row of switch networks of FIG. 5.

In accordance with another embodiment of the present invention, module 68 is a memory array whose memory cells provide data for signals $SEL_1$–$SEL_N$ and $P_1$–$P_{6M}$. The type of structure for module 68 that provides signals for the select lines and signals for the programming lines is not intended as a limitation of the present invention.

Switch networks 22 of switch matrix 23 are arranged in an array of M columns and N rows, i.e., an (M×N) matrix, where M and N are integers. For example, switch networks 22 in a first column are referenced by switch networks $22_{(1,1)}$–$22_{(1,N)}$, where the notation (1,1) indicates the first column and the first row of switch matrix 23 and the notation (1,N) indicates the first column and the Nth row of switch matrix 23. Switch networks 22 in a second column are referenced by switch networks $22_{(2,1)}$–$22_{(2,N)}$, where the notation (2,1) indicates the second column and the first row of switch matrix 23 and the notation (2,N) indicates the second column and the Nth row of switch matrix 23. Switch networks 22 in an Mth column are referenced by switch networks $22_{(M,1)}$–$22_{(M,N)}$, where the notation (M,1) indicates the Mth column and the first row of switch matrix 23 and the notation (M,N) indicates the Mth column and the Nth row of switch matrix 23. CLBs 24 and 26 have electrical interconnects configured by switch networks 22 in the (M×N) matrix. By way of example, the array of switch networks 22 provide an electrical connection from an output terminal of CLB 24 to an input terminal of CLB 26.

Switch networks 22 in the first column, referenced by switch networks $22_{(1,2)}$–$22_{(1,N)}$, are coupled to receive programming signals $P_1$–$P_6$ at input terminals IN1–IN6, respectively. Switch networks 22 in the second column, referenced by switch networks $22_{(2,2)}$–$22_{(2,N)}$, are coupled to receive programming signals $P_7$–$P_{12}$ at input terminals IN1–IN6, respectively. Switch networks 22 in the Mth column, referenced by switch networks $22_{(M,1)}$–$22_{(M,N)}$, are coupled to receive programming signals $P_{(6M-5)}$–$P_{6M}$ at input terminals IN1–IN6, respectively.

CLB 24 has input terminals SIG1 and SIG2 that are coupled to receive a signal at terminal $S_{48}$ of switch network $22_{(2,1)}$ and a signal at terminal $S_{48}$ of switch network $22_{(1,1)}$, respectively. CLB 24 has output terminals SIG3, SIG4, and SIG5 that are coupled to provide signals at terminals $S_{44}$ of switch networks $22_{(1,1)}$, $22_{(1,2)}$, and $22_{(1,N)}$, respectively. CLB 26 has input terminals SIG6, SIG7, and SIG8 that are coupled to receive a signal at terminal $S_{46}$ of switch network $22_{(M,2)}$, and a signal at terminals $S_{46}$ and $S_{50}$ of switch network $22_{(M,N)}$, respectively. CLB 26 has output terminals SIG9 and SIG10 that are coupled to provide a signal at terminals $S_{50}$ of switch network $22_{(2,N)}$ and $S_{50}$ of switch network $22_{(1,N)}$, respectively. Terminals $S_{46}$ and $S_{48}$ of switch network $22_{(M,1)}$ are not connected for this example, but could be connected to either an input or an output of a CLB.

In operation, switch networks $22_{(M,N)}$ are selected for programming when a select signal $SEL_N$ for a corresponding row is asserted. When select signal $SEL_N$ is asserted, switch networks $22_{(M,N)}$ are programmed in accordance with the programming signals $P_1$–$P_{6M}$. More particularly, a row of switch networks $22_{(M,N)}$ is selected for programming when a corresponding select signal has a logic high voltage value, i.e., a logic one. For example, row one is selected for programming when select signal $SEL_1$ is at a logic high voltage value. Similarly, row "N" is selected when select signal $SEL_N$ is at a logic high voltage value.

Once a desired row of switch networks $22_{(M,N)}$ is selected, ferroelectric transistors within switch networks $22_{(M,N)}$ (e.g., ferroelectric transistors 32, 36, 40, 52, 56, and 60 of FIG. 4) are programmed to be in either an up-polarization state or a down-polarization state in accordance with the voltage value of programming signals $P_1$–$P_{6M}$. In other words, ferroelectric transistors 32, 36, 40, 52, 56, and 60 in each switch network 22 in the first row are programmed in the "on-state" or "off-state" in accordance with the polarizing or depolarizing voltages of programming signals $P_1$–$P_{6M}$. Thus, select signal $SEL_N$ is asserted to select a row of switch networks $22_{(M,N)}$ for programming and programming signals $P_1$–$P_{6M}$ to electrically configure switch networks $22_{(M,N)}$. Once switch networks $22_{(M,N)}$ are electrically programmed, select signal $SEL_N$ is set to a logic low voltage state, i.e., de-asserted, leaving switch networks $22_{(M,N)}$ in the electrically configured state. It should be understood that the electrically configured switch networks $22_{(M,N)}$ can be re-configured by re-asserting select signal $SEL_N$ and re-programming the ferroelectric transistors with new programming signals $P_1$–$P_{6M}$.

By way of example, when select signal $SEL_1$ is at a logic one value, switch networks $22_{(1,1)}$ are programmed in accordance with programming signals $P_1$–$P_6$; switch networks $22_{(2,1)}$ are programmed in accordance with programming signals $P_7$–$P_{12}$; and switch networks $22_{(M,1)}$ are programmed in accordance with programming signals $P_{(6M-5)}$–$P_{6M}$. After the first row of switch networks $22_{(M,1)}$ are programmed, select signal $SEL_1$ is lowered and select signal $SEL_2$ is asserted. In accordance with select signal $SEL_2$ being asserted, switch networks $22_{(1,2)}$ are programmed in accordance with programming signals $P_1$–$P_6$; switch networks $22_{(2,2)}$ are programmed in accordance with programming signals $P_7$–$P_{12}$; and switch networks $22_{(M,2)}$ are programmed in accordance with programming signals $P_{(6M-5)}$–$P_{6M}$. The rows of switch networks $22_{(M,N)}$ are programmed by sequentially selecting the rows of switch networks 22 using select signals $SEL_N$ and programming the ferroelectric transistors of the switch networks using the programming signals $P_1$–$P_{6M}$. The select and programming signals are received at input terminal 70 of module 68 and serially shifted through module 68. Thus, switch matrix 23 (FIG. 3) is programmed by sequentially accessing each row of the (M×N) matrix and programming each ferroelectric transistor in each switch network $22_{(M,N)}$.

The programming signals $P_1$–$P_{6M}$ have either a polarizing voltage that polarizes a ferroelectric transistor into the up-polarization state or a depolarizing voltage that polarizes a ferroelectric transistor into the down-polarization state. The programming of each ferroelectric transistor in the (M×N) matrix opens and closes switches to provide a configurable electrical path through the matrix. The ferroelectric transistors form the switches that open or close in response to the programming. A global erasure of switch matrix 23 occurs when all of the select signals $SEL_1$–$SEL_N$ are selected together and programming signals $P_1$–$P_{6M}$ are depolarizing voltages.

Briefly referring to FIG. 4, an example is presented to further illustrate programming a switch network $22_{(M,N)}$. By way of example, a depolarizing voltage is supplied at terminals IN1, IN2, IN4 and IN6, and a polarizing voltage is supplied at terminals IN3 and IN5. With the signal SEL at a logic one value, programmable ferroelectric transistors 32, 36, 52, and 60 are programmed in the "off-state" and programmable ferroelectric transistors 40 and 56 are programmed in the "on-state". This configuration electrically couples terminal $S_{48}$ to terminal $S_{46}$ and terminal $S_{44}$ to terminal $S_{50}$. Thus, a signal appearing at terminal $S_{48}$ appears at terminal $S_{46}$ and a signal appearing at terminal $S_{44}$ appears at terminal $S_{50}$. Accordingly, particular combinations of programming signals and select signals program the ferroelectric transistors 32, 36, 40, 52, 56, and 60 in switch network 22. The conduction state of the programmable ferroelectric transistors opens and closes switches that modify electrical paths connecting one CLB with another CLB (FIG. 5).

By now it should be appreciated that a structure and method have been provided for programming switches to electrically connect input terminals of one CLB to output terminals of another CLB. The ferroelectric transistor requires less active area than the conventional static latch and transistor combination in providing the electrical connections. When the ferroelectric transistor is programmed in the up-polarization state or "on-state", the transistor functions as a switch having little voltage loss from the drain-to-source terminals. The reconfiguration of multiple ferroelectric transistor switches controls the connectivity of CLBs during normal circuit operation. In addition, the ferroelectric switches capable of retaining switch information during power interruption eliminate the need for reprogramming the FPGA after a power loss.

We claim:

1. A programmable switch, comprising:
   a plurality of ferroelectric transistors arranged to provide a connecting conduction path between a first line, a second line, a third line, and a fourth line, wherein a signal on any line can be transferred through the connecting conduction path of a ferroelectric transistor to any other line by programming the ferroelectric transistor connected between the any line and the any other line into an on-state; and
   a programming transistor having a source coupled to a gate of the ferroelectric transistor, a drain coupled for receiving a programming voltage, and a gate coupled for receiving a select signal, wherein the programming voltage programs the ferroelectric transistor into the on-state or an off-state.

2. The programmable switch of claim 1, wherein the ferroelectric transistor is an N-channel Field Effect Transistor (FET) structure.

3. The programmable switch of claim 1, wherein the programming transistor is an N-channel Field Effect Transistor (FET).

4. A field programmable switch, comprising:
   a first ferroelectric transistor having a control electrode, a first current carrying electrode coupled to a first terminal, and a second current carrying electrode coupled to a second terminal;
   a second ferroelectric transistor having a control electrode, a first current carrying electrode coupled to the second terminal, and a second current carrying electrode coupled to a third terminal;
   a third ferroelectric transistor having a control electrode, a first current carrying electrode coupled to the first terminal, and a second current carrying electrode coupled to the third terminal;
   a first programming transistor having a control electrode coupled for receiving a first select signal, a first current carrying electrode coupled to the control electrode of the first ferroelectric transistor, and a second current carrying electrode coupled for receiving a first programming voltage;
   a second programming transistor having a control electrode coupled for receiving a second select signal, a first current carrying electrode coupled to the control electrode of the second ferroelectric transistor, and a second current carrying electrode coupled for receiving a second programming voltage; and
   a third programming transistor having a control electrode coupled for receiving a third select signal, a first current carrying electrode coupled to the control electrode of the third ferroelectric transistor, and a second current carrying electrode coupled for receiving a third programming voltage.

5. The field programmable switch of claim 4, wherein the first ferroelectric transistor receives through the first programming transistor a programming voltage at the control electrode.

6. The field programmable switch of claim 4, wherein the first programming transistor and the second programming transistor are N-channel Field Effect Transistors (FETs).

7. The field programmable switch of claim 4, wherein the first ferroelectric transistor and the second ferroelectric transistor are P-channel Field Effect Transistor (FET) structures, and the first programming transistor and the second programming transistor are P-channel Field Effect Transistors (FETs).

8. A programmable switch matrix, comprising:
   an array of programmable switch elements arranged in a plurality of rows and columns, wherein a first, a second, and a third programmable switch element in the array of programmable switch elements include:
      a ferroelectric transistor having a control electrode, a first conduction terminal, and a second conduction terminal, wherein the ferroelectric transistor provides a conduction path for transferring a signal through the respective programmable switch element;
      a programming transistor having a control electrode coupled for receiving a select signal, a first current carrying electrode, and a second current carrying electrode coupled for receiving a programming voltage that programs the ferroelectric transistor either in an on-state or an off-state, the first current carrying electrode of the programming transistor coupled to the control electrode of the ferroelectric transistor; and
   a first programming line that supplies the programming voltage coupled to the second current carrying electrode of the programming transistor in the first and the third programmable switch element in the array of programmable switch elements; and
   a first select line that supplies the select signal coupled to the control electrode of the programming transistor in the first and the second programmable switch element in the array of programmable switch elements.

9. The programmable switch matrix of claim 8, further comprising:
   a second programming line that supplies another programming voltage coupled to the second current carrying electrode of the programming transistor in the second programmable switch element in the array of programmable switch elements; and a second select line that supplies another select signal coupled to the control electrode of the programming transistor in the third programmable switch element in the array of programmable switch elements.

10. The programmable switch matrix of claim 9, wherein the first conduction terminal of the ferroelectric transistor in the first programmable switch element in the array of programmable switch elements is coupled to the second conduction terminal of the ferroelectric transistor in the second programmable switch element in the array of programmable switch elements.

11. The programmable switch matrix of claim 9, wherein the second conduction terminal of the ferroelectric transistor in the first programmable switch element in the array of programmable switch elements is coupled to the second conduction terminal of the ferroelectric transistor in the third programmable switch element in the array of programmable switch elements.

12. The programmable switch matrix of claim 9, further comprising:

a module having an input and a plurality of outputs, wherein a first group of the plurality of outputs provides the programming voltage and the another programming voltage coupled to the first and second programming lines, respectively.

13. The programmable switch matrix of claim 12, wherein a second group of the plurality of outputs of the module provides the select signal and the another select signal coupled to the first and second select lines, respectively.

14. A method for programming a ferroelectric switch, comprising the steps of:

applying a selection signal to the switch;

applying a programming signal to the switch, wherein the selection signal is supplied to a control electrode of a programming transistor and the programming signal is transferred through the programming transistor to place the switch in an on-state or an off-state;

forming a conduction path when the switch is in the on-state for transferring a signal through the switch; and removing the selection signal from the switch, wherein the switch remains in the on-state or the off-state.

* * * * *